United States Patent
Kim et al.

(10) Patent No.: US 11,700,755 B2
(45) Date of Patent: Jul. 11, 2023

(54) ORGANIC LIGHT EMITTING DISPLAY DEVICE

(71) Applicant: LG Display Co., Ltd., Seoul (KR)

(72) Inventors: Taehwi Kim, Busan (KR); Hyunseok Hong, Gumi-si (KR); MinJi Kang, Chungcheongnam-do (KR)

(73) Assignee: LG Display Co., Ltd., Seoul (KR)

( * ) Notice: Subject to any disclaimer, the term of this patent is extended or adjusted under 35 U.S.C. 154(b) by 127 days.

(21) Appl. No.: 17/118,039

(22) Filed: Dec. 10, 2020

(65) Prior Publication Data

US 2021/0193783 A1     Jun. 24, 2021

(30) Foreign Application Priority Data

Dec. 23, 2019    (KR) .................. 10-2019-0172790

(51) Int. Cl.
*H10K 59/131*     (2023.01)
*H10K 50/84*     (2023.01)

(52) U.S. Cl.
CPC ......... *H10K 59/131* (2023.02); *H10K 50/841* (2023.02)

(58) Field of Classification Search
None
See application file for complete search history.

(56) References Cited

U.S. PATENT DOCUMENTS

| | | | |
|---|---|---|---|
| 10,170,534 B1 * | 1/2019 | Kim | H10K 59/124 |
| 2017/0117502 A1 * | 4/2017 | Park | H01L 27/3244 |
| 2019/0214446 A1 * | 7/2019 | Kim | H10K 59/1213 |
| 2020/0042123 A1 * | 2/2020 | Kim | H01L 51/5275 |
| 2020/0083306 A1 * | 3/2020 | Choi | H01L 51/5253 |
| 2020/0176538 A1 * | 6/2020 | Um | H10K 59/131 |
| 2020/0312933 A1 * | 10/2020 | Lee | H10K 50/844 |

FOREIGN PATENT DOCUMENTS

| KR | 10-2018-0054386 A | 5/2018 |
|---|---|---|
| KR | 10-2019-0004892 A | 1/2019 |

* cited by examiner

*Primary Examiner* — Khaja Ahmad
(74) *Attorney, Agent, or Firm* — Seed IP Law Group, LLP (57) ABSTRACT

Provided is an organic light emitting display device. The organic light emitting display device includes a substrate including an active area and an inactive area at least partially surrounding the active area, an organic light emitting element in the active area, and a conductive line disposed to have a vertically uneven shape in the inactive area and provided to transmit power to the organic light emitting element. The conductive line covers an area including at least one or more grooves in which an inorganic layer is dug.

19 Claims, 5 Drawing Sheets

ORGANIC LIGHT EMITTING DISPLAY DEVICE

CROSS-REFERENCE TO RELATED APPLICATION

This application claims the priority benefit of Korean Patent Application No. 10-2019-0172790 filed on Dec. 23, 2019, with the Korean Intellectual Property Office, the disclosure of which is incorporated herein by reference.

BACKGROUND

Technical Field

The present disclosure relates to an organic light emitting display device.

Description of the Related Art

Image display devices that implement various types of information on a screen are regarded as a core technology of the information communication era. Such image display devices are becoming thinner, lighter, and more portable, while having higher performance characteristics.

An organic light emitting element is a self-light emitting element using a thin light emitting layer between electrodes and is advantageous in terms of thinning thereof. A general organic light emitting display device has a structure in which a pixel driving circuit and an organic light emitting element are formed on a substrate, and light emitted from the organic light emitting element passes through the substrate or a barrier layer to thereby display an image.

Since the organic light emitting display device is implemented without a separate light source device, it can be easily implemented as a flexible display device. In this case, a flexible material such as plastic or metal foil may be used as the substrate of the organic light emitting display device.

BRIEF SUMMARY

The inventors of the present disclosure have identified one or more problems in the related art. Namely, the inventors recognized that because performance of the organic light emitting element degrades when the element is exposed to moisture, a moisture-proof design of an outer portion of the display device is beneficial. Accordingly, the inventors have provided a display device that implements various moisture-proof designs applied to, for example, the outer portion of the display device. The inventors have also provided a display device having a reduction in width at the outer portion (e.g., bezel) of the display device to meet the industries and the consumer desires for an aesthetically pleasing device.

Taking into consideration the problems faced in the related art (not limited to those described above), the inventors of the present disclosure provides in one or more embodiments, an organic light emitting display device having a reduced bezel structure.

Technical benefits of the present disclosure are not limited to the above-mentioned benefits, and other benefits, which are not mentioned above, can be clearly understood by those skilled in the art from the following descriptions.

According to an aspect of the present disclosure, an organic light emitting display device includes a substrate including an active area and an inactive area adjacent to the active area, an organic light emitting element in the active area, and a conductive line disposed to have a vertically uneven shape in the inactive area and provided to transmit power to the organic light emitting element. The conductive line covers an area including at least one or more grooves in which an inorganic layer is dug.

The inorganic layer may include at least one or more of a buffer layer, a gate insulating layer, an interlayer insulating layer, and a protective layer. In this case, the buffer layer may include a multi-buffer and an active buffer. The active buffer may be removed from the grooves, and the multi-buffer is not removed from the grooves.

The organic light emitting display device may further include an encapsulation layer covering the organic light emitting element. The encapsulation layer may include a first inorganic layer on the organic light emitting element, an organic layer on the first inorganic layer, and a second inorganic layer on the organic layer.

The organic light emitting display device may further include at least two or more blocking structures provided to block a flow of the organic layer of the encapsulation layer, in the inactive area.

The conductive line may not vertically overlap with a blocking structure disposed at an outermost position among the blocking structures.

The blocking structures may include a first blocking structure, a second blocking structure which is farther from the active area than the first blocking structure, and a third blocking structure which is farther from the active area than the second blocking structure. The conductive line may not vertically overlap with the third blocking structure.

The first blocking structure may be formed of a same or substantially the same material as a planarization layer and a bank of the active area. The second blocking structure may be formed by sequentially stacking materials the same as those of a planarization layer, a bank, and a spacer of the active area. The third blocking structure may be formed of a same or substantially the same material as a planarization layer of the active area.

Other detailed matters of the embodiments are included in the detailed description and the drawings.

According to embodiments of the present disclosure, an organic light emitting display device in which damage to a conductive line of an outer portion is improved can be provided. More specifically, according to embodiments of the present disclosure, a structure capable of preventing damage to conductive lines and the resultant driving failure, while having a narrow bezel, can be provided. Accordingly, moisture-proof performance and long-term reliability of the organic light emitting display device according to the embodiment of the present disclosure can be improved.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having" used herein are generally intended to allow other components to be added unless the terms are used with the term "only." Any references to singular may include plural unless expressly stated otherwise. Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly." When an element or layer is disposed "on" another element or layer, another layer or another element may be interposed directly on the other element or therebetween.

When it is described that any component is "connected" or "coupled" to another component, the component may be directly connected or coupled to another component, but it should be understood that any other component may also be "interposed" therebetween, or the respective components may be "connected," "coupled" or "joined" to each other through a third component.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated. The features of various embodiments of the present disclosure can be partially or entirely adhered to or combined with each other and can be interlocked and operated in technically various ways, and the embodiments can be carried out independently of or in association with each other.

Hereinafter, a display device according to embodiments of the present disclosure will be described in detail with reference to accompanying drawings.

Figure 1:
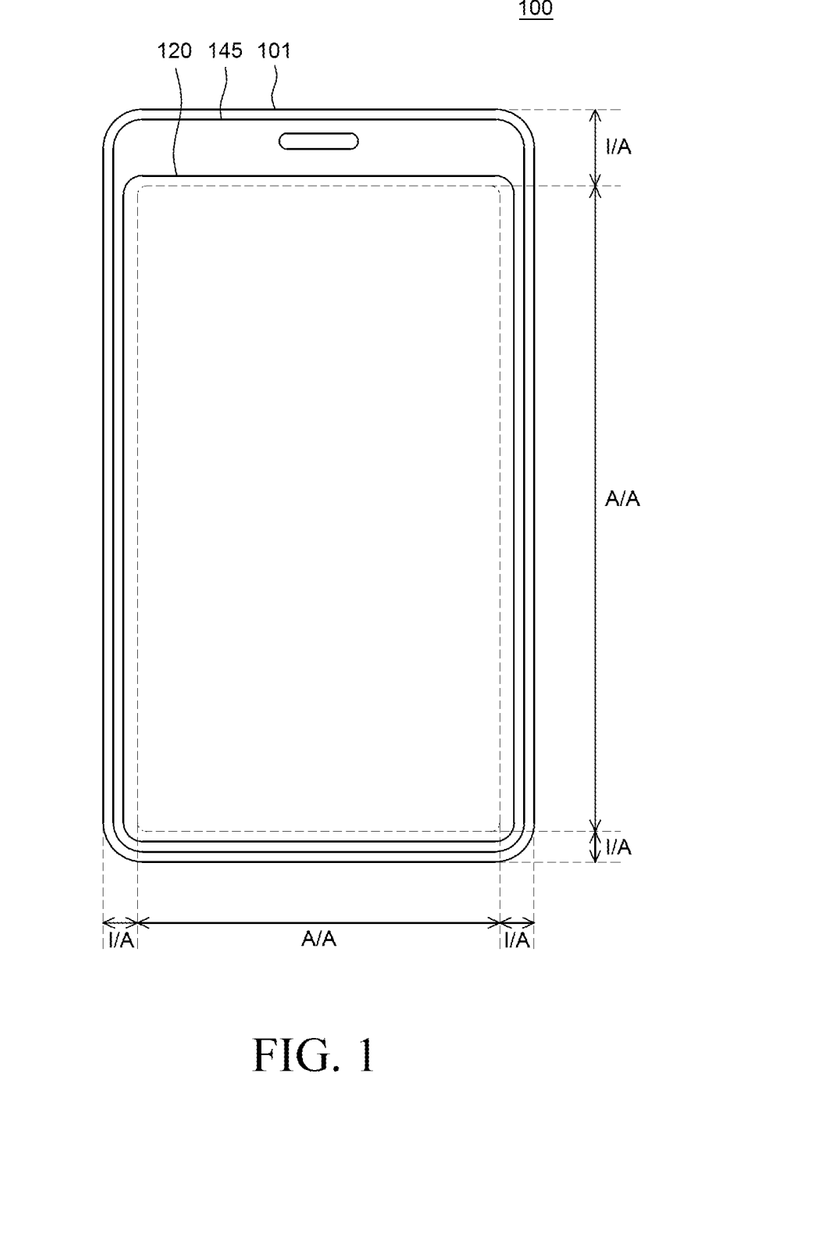
FIG. 1 is a plan view illustrating an organic light emitting display device according to an embodiment of the present disclosure.

FIG. 1 is a plan view illustrating an organic light emitting display device according to an embodiment of the present disclosure.

With reference to FIG. 1, an organic light emitting display device 100 includes at least one active area A/A, and an array of pixels is disposed in the active area. One or more inactive areas I/A may be disposed around the active area. That is, the inactive area may be adjacent to one or more side surfaces of the active area. In FIG. 1, the inactive area at least partially surrounds the active area having a rectangular shape. However, the shape of the active area, and a shape and disposition of the inactive area adjacent to the active area are not limited to an example shown in FIG. 1. The active area and the inactive area may be in a form suitable for a design of an electronic device on which the display device 100 is mounted. The shape of the active area is, for example, pentagonal, hexagonal, circular, or elliptical.

Each pixel in the active area A/A may be associated with a pixel circuit. The pixel circuit may include one or more switching transistors and one or more driving transistors. Each pixel circuit may be electrically connected to signal lines (a gate line, a data line and the like) to communicate with a gate driver, a data driver and the like located in the inactive area.

The gate driver and the data driver may be implemented as a thin film transistor (TFT) in the inactive area I/A. Such a driver may be referred to as a gate-in-panel (GIP). In addition, some components, such as data driver ICs, are mounted on a separate printed circuit board, and may be combined with a connection interface (a pad, a bump, a pin or the like) disposed in the inactive area through circuit films such as a flexible printed circuit board (FPCB), a chip-on-film (COF), a tape-carrier-package (TCP), and the like. The printed circuit (COF, PCB or the like) may be located behind the display device 100.

The organic light emitting display device 100 may include various additional elements for generating various signals or driving pixels in the active area. The additional elements for driving the pixels may include an inverter circuit, a multiplexer, an electrostatic discharge (ESD) circuit, and the like. The organic light emitting display device 100 may also include additional elements associated with functions other than pixel driving. For example, the organic light emitting display device 100 may include additional elements for providing a touch sensing function, a user authentication function (e.g., fingerprint recognition), a multi-level pressure sensing function, a tactile feedback function, and the like. The additional elements described above may be located in the inactive area and/or an external circuit connected to the connection interface.

The organic light emitting display device according to an embodiment of the present disclosure may include a substrate 101 on which a thin film transistor and an organic light emitting element are arranged, an encapsulation layer 120, a polarization layer 145, and the like.

The substrate 101 supports various components of the organic light emitting display device 100. The substrate 101 may be formed of a transparent insulating material, for example, an insulating material such as glass, plastic or the like. The substrate (array substrate) is also referred to as a concept including an element and a functional layer formed thereon, for example, a switching TFT, a driving TFT connected to the switching TFT, an organic light emitting element connected to the driving TFT, a protective film, and the like.

The organic light emitting element is disposed on the substrate 101. The organic light emitting element includes an anode, an organic light emitting layer, and a cathode. The organic light emitting element may be configured as a single light emitting layer structure that emits one light, or may be configured as a structure composed of a plurality of light emitting layers to emit white light. When the organic light emitting element emits white light, a color filter may be further provided. The organic light emitting element may be formed in a central portion of the substrate 101 to correspond to the active area.

The encapsulation layer 120 may cover the organic light emitting element. The encapsulation layer protects the organic light emitting element from external moisture or oxygen.

The organic light emitting display device 100 may be configured to have a plurality of pixels, and each of the plurality of pixels may include a plurality of sub-pixels. In this case, the sub-pixel is a minimum unit for expressing one color.

One sub-pixel circuit may include a plurality of transistors, a capacitor, and a plurality of lines. The sub-pixel circuit may be configured of two transistors and one capacitor (2T1C), but it is not limited thereto and may be implemented as a sub-pixel circuit configured of 4T1C, 7T1C, 6T2C, or the like. In addition, the sub-pixel may be implemented to be suitable for the organic light emitting display device 100 of a top emission type.

Figure 2:
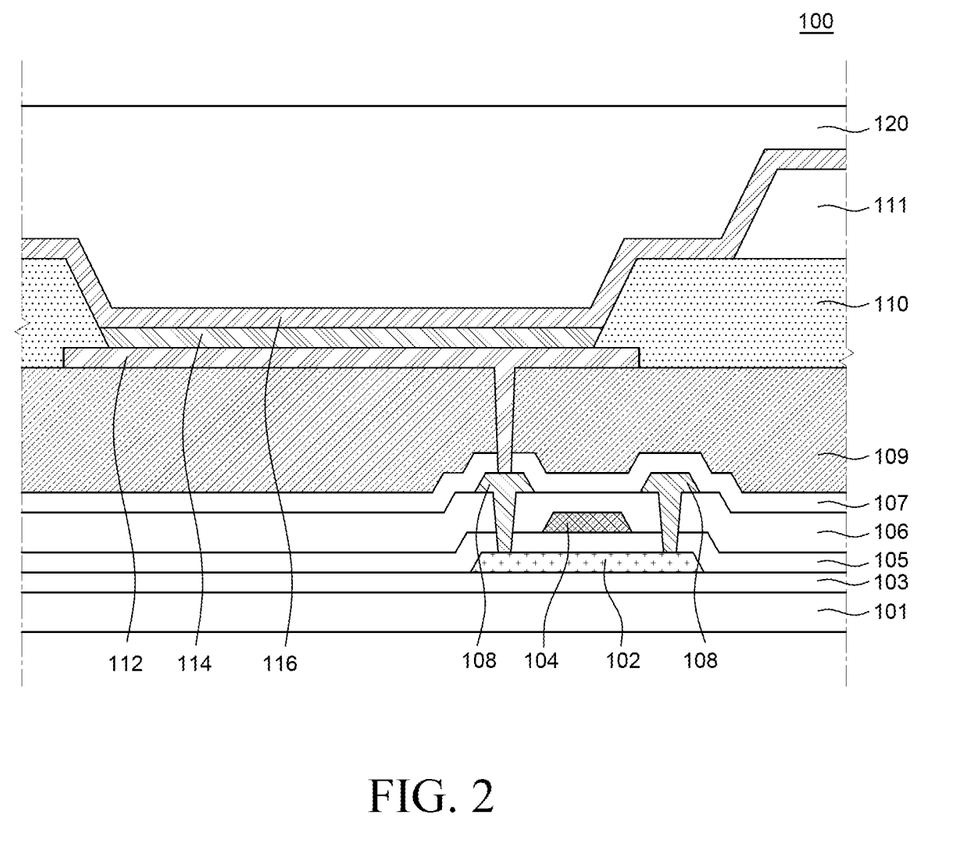
FIG. 2 is a cross-sectional view illustrating a portion of an active area of the organic light emitting display device according to an embodiment of the present disclosure.

FIG. 2 is a cross-sectional view illustrating a portion of an active area of the organic light emitting display device according to an embodiment of the present disclosure.

The organic light emitting display device 100 may include the substrate 101, a thin film transistor, an organic light emitting element, and various functional layers.

The substrate 101 serves to support and protect components of the organic light emitting display device 100 disposed thereon. The substrate 101 may be a flexible substrate formed of a ductile material having flexible characteristics. The substrate 101 may be a glass or plastic substrate. In the case of the plastic substrate, a polyimide-based or polycarbonate-based material may be used to have flexibility. In particular, polyimide can be applied to high temperature processes and is widely used for the plastic substrate because it is a material that can be coated.

A buffer layer 103 is a functional layer for protecting the electrode/line from impurities such as alkali ions or the like flowing out from the substrate 101 or lower layers. The buffer layer 103 may be formed of silicon oxide (SiOx), silicon nitride (SiNx), or a multilayer thereof. The buffer layer 103 may include a multi-buffer and/or an active buffer. The multi-buffer may be formed by alternately stacking silicon nitride (SiNx) and silicon oxide (SiOx), and may delay diffusion of moisture and/or oxygen impregnated into the substrate 101. The active buffer protects a semiconductor layer 102 of the transistor and functions to block various kinds of defects introduced from the substrate 101. The active buffer may be formed of amorphous silicon (a-Si) or the like.

The thin film transistor includes a gate electrode 104, source and drain electrodes 108, and the semiconductor layer 102. The semiconductor layer 102 may be formed of amorphous silicon or polycrystalline silicon. Polycrystalline silicon has superior mobility than amorphous silicon, and thus, has low energy consumption and excellent reliability. Recently, oxide semiconductors have been spotlighted for their excellent mobility and uniformity. The semiconductor layer 102 may include a source region including a p-type or n-type impurity, a drain region, and a channel between the source region and the drain region, and may include a low concentration-doped region between the source region and the drain region adjacent to the channel.

A gate insulating layer 105 is an insulating film composed of a single layer or multiple layers of silicon oxide (SiOx) or silicon nitride (SiNx), and is provided so that a current flowing through the semiconductor layer 102 does not flow to the gate electrode 104.

The gate electrode 104 serves as a switch to turn-on or turn-off the thin film transistor based on an electrical signal transmitted from the outside through the gate line, and may be composed of a single layer or multiple layers of copper (Cu), aluminum (Al), molybdenum (Mo), chromium (Cr), gold (Au), titanium (Ti), nickel (Ni), neodymium (Nd) or the like, which is a conductive metal, or alloys thereof. The source and drain electrodes 108 are connected to the data lines and allow electrical signals transmitted from the outside to be transferred from the thin film transistor to the organic light emitting element. The source and drain electrodes 108 may be composed of a single layer or multiple layers of copper (Cu), aluminum (Al), molybdenum (Mo), chromium (Cr), gold (Au), titanium (Ti), nickel (Ni), neodymium (Nd) or the like, which is a metallic material, or alloys thereof.

To insulate the gate electrode 104 and the source and drain electrodes 108 from each other, an interlayer insulating layer 106 composed of a single layer or multiple layers of silicon oxide (SiOx) or silicon nitride (SiNx) may be disposed between the source and drain electrodes 108.

A protective layer 107 formed of an inorganic insulating film such as silicon oxide (SiOx) or silicon nitride (SiNx) may be positioned on the thin film transistor. The protective layer 107 may prevent unnecessary electrical connections between components of the thin film transistor and prevent contamination or damage from the outside. The protective layer 107 may be omitted depending on a configuration and characteristics of the thin film transistor and the organic light emitting element.

For convenience of description, only a driving thin film transistor is illustrated among various thin film transistors, but a switching thin film transistor, a capacitor, and the like may also be included in the active area. When a signal is applied from a gate line to the switching thin film transistor, the switching thin film transistor transmits the signal from a data line to a gate electrode of the driving thin film transistor. The driving thin film transistor transmits a current transmitted through a power supply line to an anode by the signal received from the switching thin film transistor, and light emission is controlled by the current transmitted to the anode.

A planarization layer 109 is disposed on the thin film transistor. The planarization layer 109 protects the thin film transistor, alleviates a step caused by the thin film transistor, and reduces parasitic-capacitance generated between the thin film transistor, the gate line and the data line, and the organic light emitting element. The planarization layer 109 may be formed of one or more of acrylic resin, epoxy resin, phenolic resin, polyamides resin, polyimides resin, unsaturated polyesters resin, polyphenylene resin, polyphenylene sulfides resin, and benzocyclobutene.

The organic light emitting element is disposed on the planarization layer 109. The organic light emitting element includes an anode 112, a light emitting unit 114, and a cathode 116. The anode 112 may be disposed directly on the planarization layer 109. The anode 112 is an electrode that serves to supply holes to the light emitting unit 114 and may be electrically connected to the thin film transistor through a contact hole in the planarization layer 109. The anode 112 may be formed of indium tin oxide (ITO), indium zinc oxide (IZO), or the like, which is a transparent conductive material. When the organic light emitting display device 100 is a top emission type in which it emits light upwardly, it may further include a reflective layer such that the emitted light is more smoothly emitted in a direction toward an upper portion thereof where the cathode 133 is disposed. The anode 112 may be a two-layer structure in which a transparent conductive layer formed of a transparent conductive material and a reflective layer are sequentially stacked, or a three-layer structure in which a transparent conductive layer, a reflective layer, and a transparent conductive layer are sequentially stacked. The reflective layer may be formed of silver (Ag) or an alloy including silver.

In some embodiments, a bank 110 is disposed on the anode 112 and the planarization layer 109 and may define an area that emits light. The bank 110 is formed by photolithography after forming a photoresist on the anode 112. Photoresist refers to a photosensitive resin whose solubility in a developer is changed by an action of light, and a specific pattern can be obtained by exposing and developing the photoresist.

A fine metal mask (FMM) which is a deposition mask, may be used to form the light emitting unit 114 of the organic light emitting element. At this time, to prevent damage that may occur due to contact with the deposition mask disposed on the bank 110 and to maintain a constant distance between the bank 110 and the deposition mask, a spacer 111 formed of one of polyimide which is a transparent organic material, photo acryl, and benzocyclobutene (BCB) may be disposed on the bank 110.

The light emitting unit 114 is disposed between the anode 112 and the cathode 116. The light emitting unit 114 serves to emit light and may include at least one of a hole injection layer (HIL), a hole transport layer (HTL), a light emitting layer (EML), an electron transport layer (ETL), and an electron injection layer (EIL), and some components of the light emitting unit 114 may be omitted depending on a structure or characteristics of the organic light emitting display device 100.

The cathode 116 is disposed on the light emitting unit 114 and serves to supply electrons to the light emitting unit 114. Since the cathode 116 needs to supply electrons, it may be formed of a metallic material such as magnesium (Mg), silver-magnesium (Ag:Mg), which is a conductive material having a low work function. In a case where the organic light emitting display device 100 is a top emission type, the cathode 116 may be a transparent conductive oxide such as indium tin oxide (ITO), indium zinc oxide (IZO), indium tin zinc oxide (ITZO), zinc oxide (ZnO), and tin oxide (TO).

The encapsulation layer 120 for preventing oxidation or damage due to moisture, oxygen, or impurities introduced from the outside may be disposed on the organic light emitting element. The encapsulation layer 120 may be formed by stacking a plurality of inorganic layers, a foreign material compensation layer, and a plurality of barrier films. The inorganic layers may be disposed on the entire surface of an upper portion of the organic light emitting element, and may be formed of one of silicon nitride (SiNx) and aluminum oxide (AlyOz) which is an inorganic material. An additional inorganic layer may be stacked and disposed on the foreign material compensation layer. The foreign material compensation layer is disposed on the inorganic layer, and an organic material such as silicon oxycarbon (SiOCz), acryl, or epoxy-based resin may be used for the foreign material compensation layer. When a defect occurs due to a crack generated by a foreign material or particles that may be generated during a process, it may compensate for those by covering a curve and a foreign material The barrier film may be disposed on the encapsulation layer 120 to further delay penetration of oxygen and moisture from the outside. The barrier film is configured in the form of a light-transmissive and double-sided adhesive film, and may be composed of any one of olefin-based, acrylic-based, and silicon-based insulating materials. Alternatively, a barrier film composed of any one of COP (cycloolefin polymer), COC (cycloolefin copolymer) and PC (Polycarbonate) may be further used. A touch electrode (a panel), a polarizing film, a cover glass, and the like may be further positioned on the encapsulation layer 120.

Figure 3:
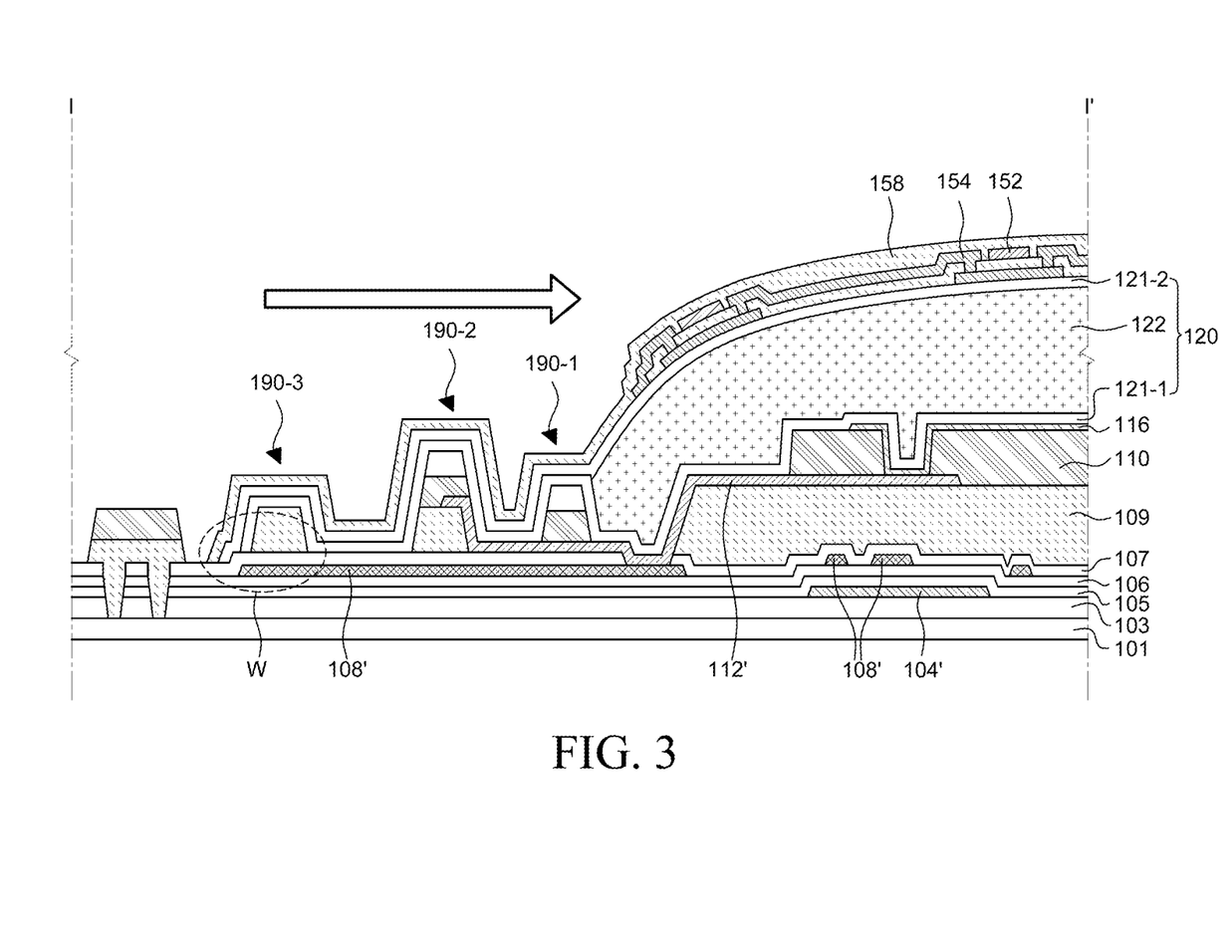
FIG. 3 is a view illustrating a portion of an inactive area of an organic light emitting display device according to another embodiment of the present disclosure.

FIG. 3 is a view illustrating a portion of an inactive area of an organic light emitting display device according to another embodiment of the present disclosure.

The inactive area I/A may be located outside the active area A/A as illustrated in FIG. 1, and a driving circuit (e.g., GIP), a power supply line, and the like may be disposed thereon. Although the pixel circuit and the light emitting element are not disposed in the inactive area I/A, the substrate 101 and organic/inorganic functional layers 103, 105, 107, 109, 120, and the like may exist therein. In addition, materials used in configuring the active area A/A may be disposed in the inactive area I/A for other uses. For example, a metal 104' the same as the gate electrode of the TFT of the active area, or a metal 108' the same as the source/drain electrode may be disposed in the inactive area I/A for lines or electrodes. Furthermore, a metal 112' the same as one electrode (e.g., an anode) of an organic light emitting diode may be disposed in the inactive area I/A for lines and electrodes.

The encapsulation layer 120 covers an upper portion of the organic light emitting element. The encapsulation layer may be composed of an inorganic layer formed of glass, metal, an aluminum oxide (AlOx) or silicon (Si)-based material, or may have a structure in which an organic layer and an inorganic layer are alternately stacked. Inorganic layers 121-1 and 121-2 serve to block penetration of moisture and oxygen, and an organic layer 122 serves to flatten surfaces of the inorganic layers 121-1 and 121-2.

The organic layer 122 has a certain degree of flowability, and may flow to the outside of the inactive area during application. Accordingly, blocking structures 190-1, 190-2 and 190-3 are disposed to control spreading of the organic layer 122 to the inactive area I/A. FIG. 3 illustrates that three blocking structures 190-1, 190-2 and 190-3, that is, three dams 190-1, 190-2 and 190-3 are disposed, but the number of dams may be varied. Further, in some embodiments, the dams 190-1, 190-2, and 190-3 may be disposed to surround the active area A/A or may be disposed within the active area A/A. The dams 190-1, 190-2 and 190-3 may be formed of multiple layers using at least one or more materials. For example, the dams 190-1, 190-2 and 190-3 can be manufactured using materials used in forming the planarization layers 109, the bank 110, and the spacer.

On the encapsulation layer 120, a touch sensing line 154 and a touch driving line 152 may be alternately disposed with a touch insulating layer 158 interposed therebetween. Mutual capacitance (Cm) is formed at an overlapping location of the touch sensing line 154 and the touch driving line 152. Accordingly, the mutual capacitance Cm serves as a touch sensor by charging charges by a touch driving pulse supplied to the touch driving line 152 and discharging the charged charges to the touch sensing line 154.

The touch driving line 152 includes a plurality of first touch electrodes and first bridges that electrically connect the first touch electrodes to one another. The plurality of first touch electrodes are spaced apart at regular intervals along a first direction. Each of the plurality of first touch electrodes is electrically connected to the first touch electrode adjacent thereto through a first bridge. The first bridge is disposed on the same layer as the first touch electrode and can be electrically connected to the first touch electrode without a separate contact hole.

The touch sensing line 154 includes a plurality of second touch electrodes and second bridges that electrically connect the plurality of second touch electrodes. The plurality of second touch electrodes are spaced apart at regular intervals along a second direction. Each of the plurality of second touch electrodes is electrically connected to the second touch electrode adjacent thereto through a second bridge. The second bridge is disposed on a layer different from the second touch electrode and can be electrically connected to the second touch electrode through a contact hole.

Each of the first and second touch electrodes and the first and second bridges may be formed in a single layer or multilayer structure with the use of a conductive layer having high corrosion resistance and acid resistance and good conductivity, such as aluminum (Al), titanium (Ti), copper (Cu), or molybdenum (Mo). For example, each of the first and second touch electrodes and the first and second bridges is formed as a stacked three-layer structure such as Ti/Al/Ti or Mo/Al/Mo.

Each of the touch driving line 152 and the touch sensing line 154 is connected to a touch driver through a routing line and a touch pad disposed in the inactive area. Accordingly, the routing line transmits the touch driving pulse generated by the touch driver to the touch driving line 152 through the touch pad, and transmits a touch signal from the touch sensing line 154 to the touch pad.

Various circuits and electrodes/lines disposed in the inactive area I/A may be formed of the gate metal 104' and/or the source/drain metal 108'. At this time, the gate metal 104' and the gate electrode of the TFT are formed using the same or substantially the same material in the same process, and the source/drain metal 108' and the source/drain electrode of the TFT are formed using the same or substantially the same material in the same process.

For example, the source/drain metal may be used as a power supply (e.g., low level power supply (VSS), high level power supply (VDD) or the like) line 108'. At this time, the power supply line 108' is connected to the metal layer 112', and the cathode 116 of the organic light emitting element is supplied with power through connection with the source/drain metal 108' and the metal layer 112'. The metal layer 112' may come into contact with the power supply line 108', and extend along a sidewall of an outermost portion of the planarization layer 109 to thereby be in contact with the cathode 116 on the planarization layer 109. The metal layer 112' and the anode 112 of the organic light emitting diode may be formed using the same or substantially the same material in the same process.

The inventors have discovered vulnerable points in an outer portion structure of the organic light emitting display device as shown in FIG. 3. One of the vulnerable points is moisture permeation which is shown in the vicinity (W) of an end portion of the power supply line 108'.

The power supply line 108' is designed to be as wide as possible in order to reduce resistance and stably supply power. Accordingly, the end portion of the power supply line 108' overlaps with the blocking structure 190-3 disposed at an outermost position to a predetermined degree. Since adhesion between the power supply line 108' and the protective layer 107 disposed thereon is not high, an end of the insulating layer 158 disposed outwardly of the blocking structure 190-3 is contracted, thereby lifting the inorganic layers 121-1 and 121-2 disposed below. Consequently, a void is caused between the power supply line 108' and the protective layer 107 disposed thereon. In addition, the inorganic layers 121-1 and 121-2 may not completely cover the power supply line 108' due to process variations and shadows of the inorganic layers 121-1 and 121-2 of the encapsulation layer.

When moisture penetrates into the void and/or incompletely covered portions caused for these reasons, corrosion of the power supply line 108' occurs. As a result, the line metal may be eluted or deformed, and interlayer delamination may also diffuse, thereby leading to poor driving of the display device.

The inventors of the present disclosure have recognized vulnerabilities and dangers described above, and have invented a structure to prevent moisture permeation and corrosion of conductive lines in the outer portion.

Figure 4:
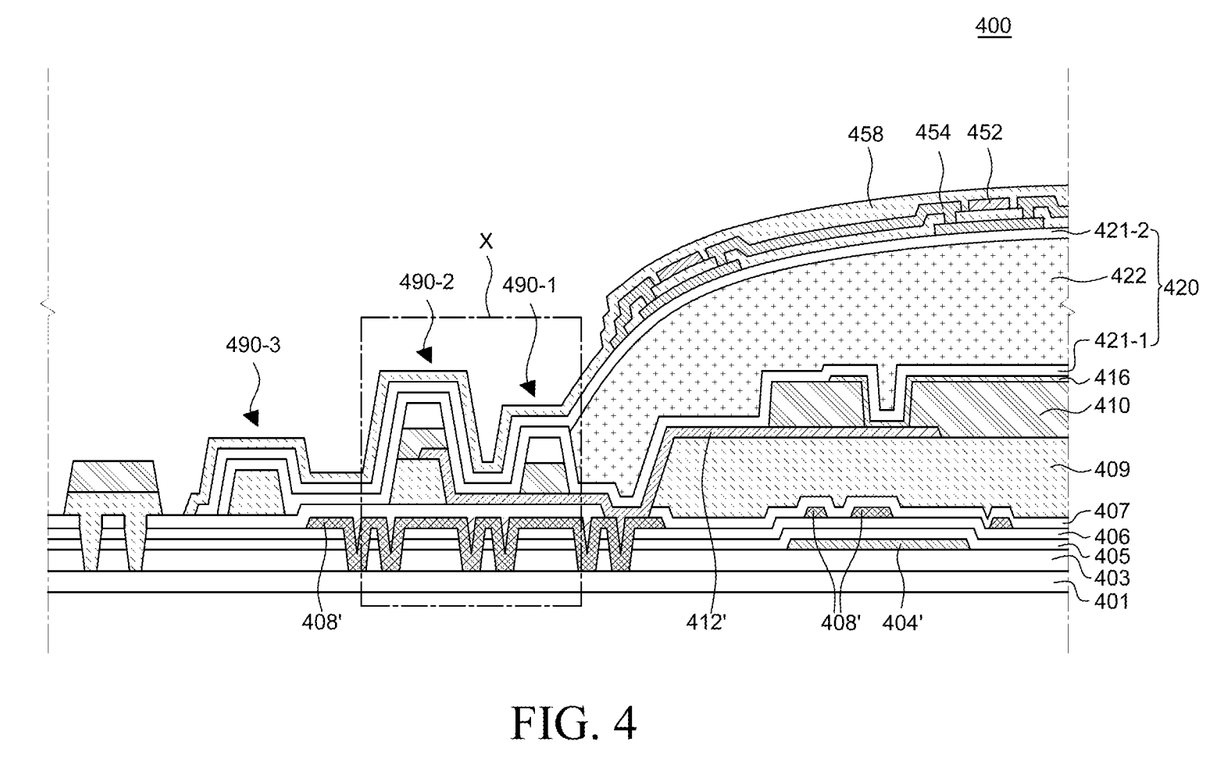
FIG. 4 is a view illustrating an outer portion structure applied to the organic light emitting display device according to another embodiment of the present disclosure.
Figure 5:
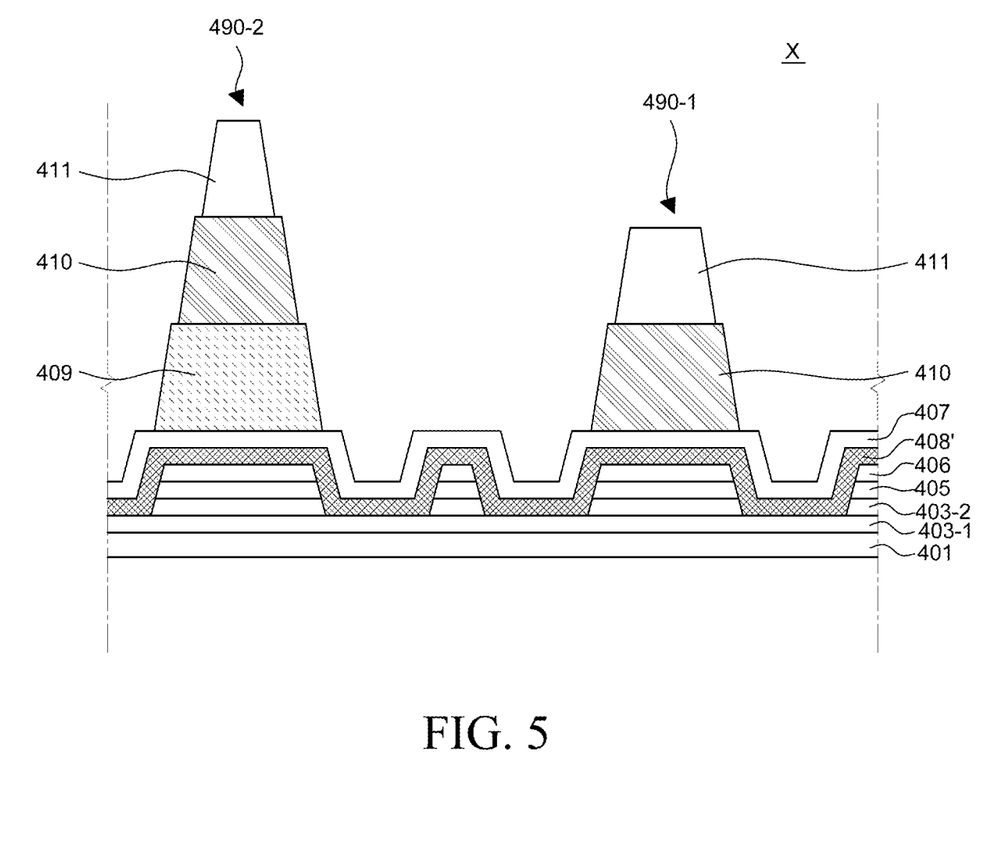
FIG. 5 is an enlarged view of portion X of FIG. 4.

FIG. 4 is a view illustrating an outer portion structure applied to the organic light emitting display device according to another embodiment of the present disclosure. FIG. 5 is an enlarged view of portion X of FIG. 4.

Among components in FIG. 4, a duplicate description of the same components as those in FIGS. 1 to 3 will be omitted. The organic light emitting display device according to the embodiment may include a structure, in which a line width is adjusted so that a conductive line 408' of the inactive area is not placed at an outer edge and an increase in resistance due to the conductive line is suppressed. A structure of the conductive line may be provided by imparting a shape in which the conductive line 408' has unevenness in a vertical direction. As an example, the conductive line 408' in the outer portion is provided only up to an inside of the blocking structure disposed at an outermost position, so that it has a surface area maintained the same as or similarly to the previous one, while having unevenness using a groove (a recessed area) from which the lower inorganic layers are removed.

The organic light emitting display device according to the embodiment includes a substrate 401 having an active area A/A and an inactive area I/A at least partially surrounding the active area A/A. The organic light emitting display device includes an organic light emitting element in the active area A/A. The organic light emitting display device further includes the conductive line 408' disposed to have a vertically uneven shape in the inactive area FA and configured to transmit power to the organic light emitting element. As shown in FIGS. 4 and 5, the conductive line 408' has an uneven shape in a vertical direction. In some embodiments, at least some portions of the conductive line 408' are not deposited on the same layer. That is, some portions of the conductive line 408' may not be coplanar with each other. In other embodiments, at least some portions of the conductive line 408' may extend through to contact other layers than that the conductive line 408' is deposited on. For example, some portions of the conductive line 408' may extend to contact the substrate 401.

The conductive line 408' may be a power supply line that transmits a low level power supply ($V_{SS}$) to the organic light emitting element. The conductive line 408' may be formed of the same or substantially the same material (e.g., Ti/Al/Ti) as the source or drain electrode of the thin film transistor. The conductive line 408' may cover an area including at least one or more grooves in which the inorganic layers are dug. That is, the uneven shape of the conductive line 408' can be obtained by providing at least one or more grooves by etching or the like, and then, depositing the conductive line 408' on the groove and a flat portion around the groove. The inorganic layers may include at least one or more of a buffer layer 403, a gate insulating layer 405, an interlayer insulating layer 406, and a protective layer 407. With reference to FIG. 5, it can be seen that only a portion of the buffer layer 403 is removed when preparing the groove. For example, the buffer layer 403 includes a multi-buffer 403-1 and an active buffer 403-2, and the active buffer 403-2 is removed from the groove, while the multi-buffer 403-1 may not be removed from the groove, which can be applied as a means for adjusting a depth of the groove. If a deeper groove is needed, even the multi-buffer 403-1 can be removed. The depth, a disposition interval, a width and the like of the groove may vary depending on designing the surface area of the conductive line.

The organic light emitting display device may further include an organic light emitting element on the planarization layer 409; and an encapsulation layer 420 covering the organic light emitting element. At this time, the encapsulation layer 420 may include a first inorganic layer 421-1 on the organic light emitting element; an organic layer 422 on the first inorganic layer 421-1; and a second inorganic layer 421-2 on the organic layer 422.

The organic light emitting display device may further include a bank 410 on the planarization layer 409. The bank 410 divides a boundary between (sub) pixels. That is, an area to which the bank 410 is opened is one light emitting unit as a light emitting area. The bank 410 may also be used to form a blocking structure.

The organic light emitting display device may further include blocking structures 490-1, 490-2, and 490-3 provided to block a flow of the organic layer 422 of the encapsulation layer 420 in the inactive area I/A. A plurality of the blocking structures may be provided. For example, the blocking structures 490-1, 490-2, and 490-3 may include a first blocking structure 490-1 which is closest to the active area; a second blocking structure 490-2 which is farther from the active area than the first blocking structure 490-1; and a third blocking structure 490-3 which is farther from the active area than the second blocking structure 490-2, that is, which is closer to an end portion of the substrate 401. In this case, the first blocking structure 490-1 may have a relatively low height, and the second blocking structure 490-2 may have a relatively high height. The first blocking structure 490-1 may be formed of the same or substantially the same material as the planarization layer 409 and the bank 410 of the active area. The second blocking structure 490-2 may be formed by sequentially stacking materials the same as the planarization layer 409, the bank 410, and the spacer of the active area. That is, the first blocking structure 490-1 may be stacked in two stages, and the second blocking structure 490-2 may be stacked in three stages. The third blocking structure 490-3 may be formed of the same or substantially the same material as the planarization layer 409 of the active area.

The conductive line 408' does not vertically overlap with the blocking structure disposed at the outermost position among the blocking structures. If three blocking structures are disposed as shown in FIG. 4, the conductive line 408' does not overlap with the third blocking structure 490-3. This is because that, as described above with reference to FIG. 3, moisture permeation due to cracking or delamination may occur in an area where the conductive line and the outermost blocking structure overlap with each other.

Meanwhile, a metal layer 412' may be provided to transmit power supplied through the conductive line 408' to the organic light emitting element. The metal layer 412' connects the conductive line 408' and a cathode electrode 416 of the organic light emitting element. At this time, the metal layer 412' may extend along a side surface (a side wall) of the planarization layer 409. The metal layer 412' may be formed of the same or substantially the same material as an anode electrode of the organic light emitting element. The metal layer 412' may be provided with an outgassing hole for discharging gas generated in the planarization layer under the metal layer 412'.

When the conductive line structure of the outer portion is provided as described above, damage to the conducive line due to moisture permeation or cracking can be suppressed. In addition, such a conductive line structure can increase reliability by reducing a driving failure of the display device.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure. All the technical concepts in the present disclosure and the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An organic light emitting display device, comprising:
a substrate having an active area and an inactive area at least partially surrounding the active area;
an inorganic layer including a multi-buffer and an active buffer on the substrate and having grooves;
an organic light emitting element in the active area; and
a conductive line disposed to have a vertically uneven shape in the inactive area and configured to transmit power to the organic light emitting element,
wherein the active buffer is removed from the grooves, and the multi-buffer is not removed from the groove.

2. The organic light emitting display device of claim 1, wherein the conductive line at least partially covers an area including at least one groove in the inorganic layer.

3. The organic light emitting display device of claim 2, wherein the inorganic layer further includes at least one of a gate insulating layer, an interlayer insulating layer, and a protective layer.

4. The organic light emitting display device of claim 1, further comprising: an encapsulation layer at least partially covering the organic light emitting element,
wherein the encapsulation layer includes:
a first inorganic layer on the organic light emitting element;
an organic layer on the first inorganic layer; and
a second inorganic layer on the organic layer.

5. The organic light emitting display device of claim 4, further comprising: at least two or more blocking structures in the inactive area, wherein the at least two or more blocking structures are configured to block a flow of the organic layer of the encapsulation layer.

6. The organic light emitting display device of claim 5, wherein the conductive line does not vertically overlap with a blocking structure disposed at an outermost position among the blocking structures.

7. The organic light emitting display device of claim 5, wherein the blocking structures include a first blocking structure, a second blocking structure which is farther from the active area than the first blocking structure, and a third blocking structure which is farther from the active area than the second blocking structure,
wherein the conductive line does not vertically overlap with the third blocking structure.

8. The organic light emitting display device of claim 7, wherein the first blocking structure is formed of a same or substantially the same material as a planarization layer and a bank of the active area.

9. The organic light emitting display device of claim 7, wherein the second blocking structure is formed by sequentially stacking materials the same as those of a planarization layer, a bank, and a spacer of the active area.

10. The organic light emitting display device of claim 7, wherein the third blocking structure is formed of a same or substantially the same material as a planarization layer of the active area.

11. The organic light emitting display device of claim 7, wherein the first blocking structure includes a same or substantially the same materials as a planarization layer and a bank of the active area.

12. The organic light emitting display device of claim 7, wherein the second blocking structure includes a same or substantially the same materials as those of a planarization layer, a bank, and a spacer of the active area.

13. The organic light emitting display device of claim 7, wherein the third blocking structure includes a same or substantially the same material as a planarization layer of the active area.

14. The organic light emitting display device of claim 1, wherein the conductive line at least partially fills at least one groove in an inorganic layer.

15. An organic light emitting display device, comprising:
a substrate having an active area and an inactive area at least partially surrounding the active area;
an inorganic layer including a multi-buffer and an active buffer on the substrate, the inorganic layer having grooves;
an organic light emitting element in the active area; and
a conductive line having a vertically uneven shape in the inactive area and configured to transmit power to the organic light emitting element,
wherein the active buffer is not present in the grooves, and the multi-buffer is present in the grooves.

16. The organic light emitting display device of claim 15, wherein the conductive line at least partially covers an area including at least one groove in the inorganic layer.

17. The organic light emitting display device of claim 16, wherein the inorganic layer further includes at least one of a gate insulating layer, an interlayer insulating layer, and a protective layer.

18. The organic light emitting display device of claim 15, further comprising: an encapsulation layer at least partially covering the organic light emitting element,
wherein the encapsulation layer includes:
a first inorganic layer on the organic light emitting element;
an organic layer on the first inorganic layer; and
a second inorganic layer on the organic layer.

19. The organic light emitting display device of claim 18, further comprising: at least two or more blocking structures in the inactive area, wherein the at least two or more blocking structures are configured to block a flow of the organic layer of the encapsulation layer.

* * * * *

UNITED STATES PATENT AND TRADEMARK OFFICE
CERTIFICATE OF CORRECTION

| | | |
|---|---|---|
| PATENT NO. | : 11,700,755 B2 | Page 1 of 1 |
| APPLICATION NO. | : 17/118039 | |
| DATED | : July 11, 2023 | |
| INVENTOR(S) | : Taehwi Kim et al. | |

It is certified that error appears in the above-identified patent and that said Letters Patent is hereby corrected as shown below:

On the Title Page

Item (72) Inventors:
"MinJi Kang, Chungcheongnam-do (KR)" should read: --MinJi Kang, Seocheon-gun (KR)--.

Signed and Sealed this
Second Day of July, 2024

Katherine Kelly Vidal
*Director of the United States Patent and Trademark Office*